(12) United States Patent
Yanagisawa et al.

(10) Patent No.: US 6,280,645 B1
(45) Date of Patent: Aug. 28, 2001

(54) WAFER FLATTENING PROCESS AND SYSTEM

(75) Inventors: Michihiko Yanagisawa; Shinya Iida, both of Ayase; Yasuhiro Horiike, Houya, all of (JP)

(73) Assignee: Yasuhiro Horiike and SpeedFam Co, Ltd., Tokyo (JP)

( * ) Notice: Subject to any disclaimer, the term of this patent is extended or adjusted under 35 U.S.C. 154(b) by 0 days.

(21) Appl. No.: 09/336,631

(22) Filed: Jun. 18, 1999

(30) Foreign Application Priority Data

Jul. 21, 1998 (JP) .................................................. 10-205548

(51) Int. Cl.$^7$ ..................... H01L 21/3065; H01L 21/302; H01L 21/4763
(52) U.S. Cl. ................................. 216/38; 216/67; 216/79; 438/697; 438/706; 438/707
(58) Field of Search .................................. 216/38, 58, 59, 216/63, 67, 69, 74, 79; 438/689, 694, 697, 706, 707

(56) References Cited

U.S. PATENT DOCUMENTS

| | | |
|---|---|---|
| 4,412,885 | 11/1983 | Wang et al. . |
| 4,936,940 | 6/1990 | Kawasumi et al. . |
| 5,108,543 | 4/1992 | Suzuki et al. . |
| 5,240,554 | 8/1993 | Hori et al. . |
| 5,795,493 | * 8/1998 | Bukhman et al. ...................... 216/59 |
| 5,980,769 | * 11/1999 | Yanagisawa et al. .................. 216/67 |
| 5,981,381 | * 11/1999 | Tanimoto et al. .................... 438/645 |

FOREIGN PATENT DOCUMENTS

| | | |
|---|---|---|
| 9-27482 | 1/1997 | (JP) . |
| 9-115887 | 2/1997 | (JP) . |

\* cited by examiner

*Primary Examiner*—Randy Gulakowski
*Assistant Examiner*—J. Smetana
(74) *Attorney, Agent, or Firm*—Burr & Brown (57) ABSTRACT

A wafer flattening process and system enables a reduction of the surface roughness of a wafer resulting from local etching. A silicon wafer W is brought into close proximity to a nozzle portion 20 to feed $SF_6$ gas to an alumina discharge tube 2, a plasma generator 1 is used to cause plasma discharge and spray a first activated species gas from the nozzle portion 20 to the silicon wafer W side, an X-Y drive mechanism 4 is used to make the nozzle portion 20 scan to perform a local etching step. Then the silicon wafer W is moved away from the nozzle portion 20 and $O_2$ gas and $CF_4$ gas are fed to the alumina discharge tube. At this time, the $O_2$ gas is set to be greater in amount than the $CF_4$ gas. When this mixed gas is made to discharge to generate plasma, a second activated species gas diffuses from the nozzle portion 20 to the entire surface of the silicon wafer W. Since there is a larger amount of O radicals than F radicals, the reaction product resulting from the O radicals deposit in fine depressions causing roughness and the front surface of the silicon wafer W is smoothed.

6 Claims, 7 Drawing Sheets

| SILICON WAFER NO. | 1 | 2 | 3 | 4 | 5 | 6 | 7 | 8 | 9 |
|---|---|---|---|---|---|---|---|---|---|
| INITIAL RMS (UNIT=NM) | 0.3 | 0.1 | 0.4 | 0.8 | 0.3 | 0.6 | 0.4 | 0.2 | 0.8 |
| RMS AFTER LOCAL ETCHING (UNIT=NM) | 1.0 | 0.9 | 2.2 | 3.3 | 2.5 | 2.9 | 2.6 | 0.9 | 5.0 |
| RMS AFTER LOCAL ETCHING+FLATTENING (UNIT=NM) | 0.2 | 0.2 | 0.3 | 0.6 | 0.3 | 0.7 | 0.4 | 0.3 | 0.5 |

WAFER FLATTENING PROCESS AND SYSTEM

BACKGROUND OF THE INVENTION

1. Field of the Invention

The present invention relates to a wafer flattening process for etching and flattening projecting portions of a wafer surface locally by an activated species gas or locally etching relative thick portions of a wafer to achieve a uniform distribution of thickness of the wafer and to a system for the same.

2. Description of the Related Art

Figure 11:
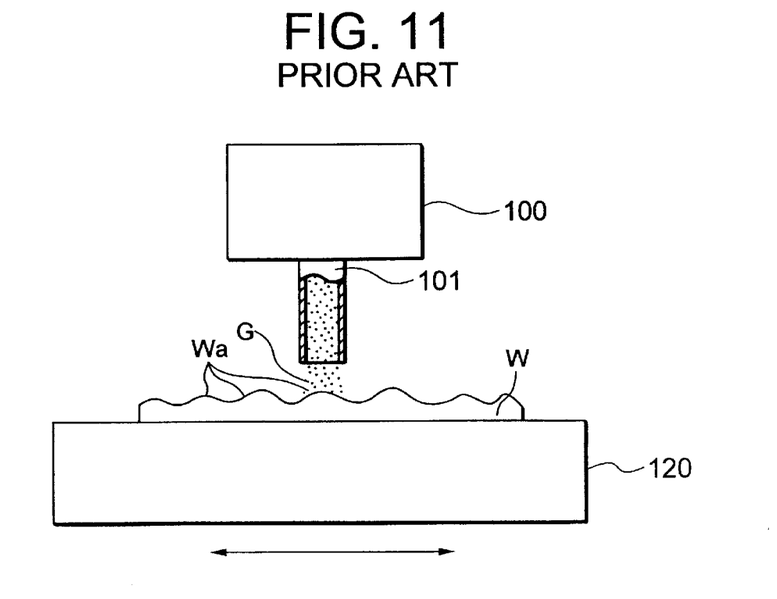
FIG. 11 is a schematic cross-sectional view of an example of the wafer flattening process of the related art.

FIG. 11 is a schematic cross-sectional view of an example of a wafer flattening process of the related art.

In FIG. 11, reference numeral 100 is a plasma generation unit. Activated species gas G in the plasma generated by the plasma generator unit 100 is sprayed on the front surface of a wafer W from a nozzle 101.

The wafer W is placed and fixed on a stage 120. The stage 120 is made to move in the horizontal direction to guide a portion relatively thicker than a prescribed thickness on the front surface of the wafer W (hereinafter referred to as a "relatively thick portion") directly under the nozzle 101.

The activated species gas G is then sprayed from the nozzle 101 to the projecting relatively thick portion Wa to locally etch the relatively thick portion Wa and achieve a uniform distribution of thickness of the front surface of the wafer W.

The thickness of the relatively thick portion Wa of the wafer W is not however uniform but is diverse.

Therefore, a technique has been devised for controlling the relative speed of the nozzle 101 with respect to the wafer W to match with the thickness of the relatively thick portion Wa (for example, the technology disclosed in Japanese Patent Laid-Open No. 9-27482).

This technique calls for measuring the positions and thicknesses of relatively thick portions Wa over the entire surface of the wafer W by a wafer flatness measurement apparatus to create two-dimensional position-thickness data. This data is converted to position-relative speed data showing the positions of the relatively thick portions Wa and the relative speeds of the nozzle 101 for making the relatively thick portions Wa a desired flatness after the etching.

Next, the stage 120 is controlled based on the position-relative speed data to make the nozzle 101 directly over predetermined relatively thick portions Wa to etch the entire surface of the wafer W.

That is, at a relatively thick portion Wa with a large thickness, the relative speed of the nozzle 101 is reduced to increase the amount of etching, while at a relatively thin portion Wa with a small thickness, the relative speed of the nozzle 101 is increased to reduce the amount of etching so as to thereby flatten the entire surface of the wafer W.

In the above wafer flattening process of the related art, however, there were the following problems.

Since the ions in the plasma generated at the plasma generation unit 100 are accelerated by the potential difference applied between the plasma and the wafer W and strike the wafer W, just the portions which the ions strike are etched to a large degree. Further, the atoms of the surface of the wafer W are removed by the sputtering. Therefore, the surface of the wafer W is roughened on an atomic order.

Further, the particles floating around the wafer W and the particles generated in the discharge tube forming the nozzle 101 deposit on the front surface of the wafer W. The etching characteristics of the portions where the particles are deposited decline. As a result, the amounts of etching of the portions where the particles are deposited and the portions where they are not deposited become different and the front surface of the wafer W becomes rough.

Due to the above reasons, local etching ends up resulting in a larger mean squared roughness (hereinafter referred to as the "IRMS") of the front surface of the wafer W. When the front surface of the wafer W after the local etching is observed by an interatomic microscope, it is seen that when a wafer W with an RMS before local etching smaller than 1 nm is locally etched by the above wafer flattening process, the RMS ends up deteriorating about 10 nm.

SUMMARY OF THE INVENTION

The present invention was made to solve the above problems and has as its object to provide a wafer flattening process and system enabling a reduction of the surface roughness of the wafer caused by local etching.

To achieve the above object, according to the aspect of the invention, there is provided a wafer flattening process comprising: a local etching step for spraying a first activated species gas, generated by causing a fluorine compound gas or a first mixed gas containing a fluorine compound to discharge and generate a plasma, from a nozzle portion of a first discharge tube to a relatively thick portion of the surface of the wafer to locally etch the relatively thick portion; and a smoothing step for spraying a second activated species gas, generated by making a second mixed gas containing carbon tetrafluoride and oxygen discharge to generate a plasma, over the entire surface of the wafer after the local etching step.

Due to this configuration, when a fluorine compound gas or first mixed gas is made to discharge to generate a plasma in the local etching step, a first activated species gas containing fluorine radicals is generated and the relatively thick portions of the wafer are locally etched by the fluorine radicals. Next, by spraying the second activated species gas over the entire surface of the wafer in the smoothing step, a predetermined reaction product is deposited by the oxygen radicals in the second activated species gas inside the fine recesses of the surface of the wafer causing surface roughness and therefore the entire surface of the wafer is smoothed.

The fluorine compound in the local etching step need only be able to generate fluorine radicals by discharge to generate plasma. As one example, the aspect of the invention, the fluorine compound in the local etching step is one of carbon tetrafluoride, sulfur hexafluoride, and nitrogen trifluoride.

On the other hand, the second mixed gas in the smoothing step is used for depositing reaction products in the fine recesses of the surface of the wafer caused by local etching to smooth the surface, so it is preferable that a ratio of mixture giving a second activated species gas containing a larger amount of oxygen radicals than fluorine radicals. The aspect of the invention, the ratio of oxygen to carbon tetrafluoride in the smoothing step is set to 200 to 400 percent.

In the smoothing step, any method may be used to spray the second activated species gas over the entire surface of the wafer, but as an example the invention, the smoothing step diffuses and sprays the second active species gas from the nozzle portion of the second discharge tube facing the front surface of the wafer a predetermined distance away from it to the entire front surface of the wafer.

Further, in the smoothing step, it is preferable that the second activated species gas uniformly strike the surface of the wafer when diffusing and spraying the second activated species gas from the nozzle portion of the second discharge tube to the entire front surface of the wafer. Therefore, the aspect of the invention, the center of the nozzle portion of the second discharge tube and the center of the wafer are substantially aligned and the wafer is made to rotate on the center. Further, the aspect of the invention, the center of the nozzle portion of the second discharge tube and the center of the wafer are offset and the wafer is made to revolve around the center of the nozzle portion.

Note that systems capable of specifically realizing the wafer flattening processes according to the invention, also stand as product inventions.

Therefore, the aspect of the invention, there is provided a wafer flattening system comprising: a local etching device provided with a first gas feed unit for supplying to a first discharge tube having an opening of a nozzle portion facing the front surface of the wafer a fluorine compound gas or a first mixed gas containing a fluorine compound, a first plasma generation unit for causing the fluorine compound gas or first mixed gas containing a fluorine compound in the first discharge tube to discharge to generate a plasma and generate a first activated species gas, and first drive unit for causing the nozzle portion to move relatively along the front surface of the wafer; and a smoothing device provided with a second discharge tube having a nozzle portion for spraying a second activated species gas over the entire surface of the wafer, a second gas feed unit for feeding a second mixed gas containing carbon tetrafluoride and oxygen to the second discharge tube, and a second plasma generation unit for causing the second mixed gas in the second discharge tube to discharge to generate a plasma and generate the second activated species gas.

Further, the aspect of the invention, the fluorine compound in the first gas feed unit is one of carbon tetrafluoride, sulfur hexafluoride, and nitrogen trifluoride.

Further, the aspect of the invention, the ratio of oxygen to carbon tetrafluoride in the second gas feed unit is set to 200 to 400 percent. Further, the aspect of the invention, the opening of the nozzle portion of the second discharge tube is made to face the front surface of the wafer and the distance between the opening and front surface of the wafer is set to a distance where the second activated species gas diffuses over the entire front surface of the wafer. Further, the aspect of the invention, the smoothing device is provided with a second drive unit for making the nozzle portion of the second discharge tube relatively along with front surface of the wafer.

BRIEF DESCRIPTION OF THE DRAWINGS

The above and other objects, features, and advantages of the present invention will become more readily apparent from the following description of presently preferred embodiments of the invention taken in conjunction with the accompanying drawings, in which.

DESCRIPTION OF THE PREFERRED EMBODIMENTS

Below, embodiments of the present invention will be explained with reference to the drawings.

(First Embodiment)

Figure 1:
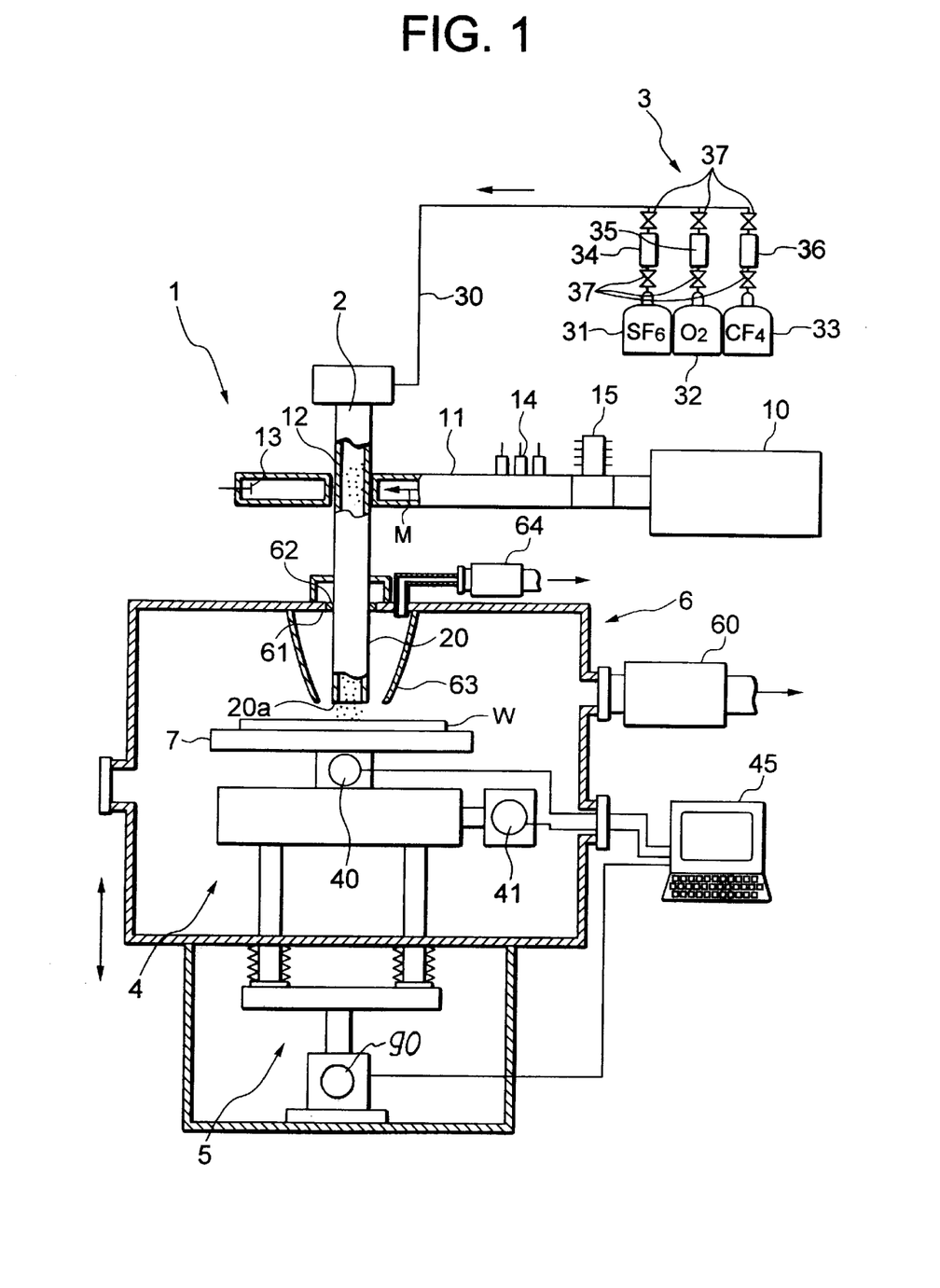
FIG. 1 is a schematic cross-sectional view of a wafer flattening system according to a first embodiment of the present invention.

FIG. 1 is a view of the configuration of a wafer flattening system according to a first embodiment of the present invention.

The wafer flattening system is provided with a local etching device for locally etching the silicon wafer W and a smoothing device for smoothing the silicon wafer W after local etching.

Specifically, the wafer flattening system is provided with a plasma generator 1 serving as the first and second plasma generation units, an alumina discharge tube 2 serving as the first and second discharge tubes, a gas feed device 3 serving as the first and second gas feed units, an X-Y drive mechanism 4 serving as first and second X-Y drive units, and a Z-drive mechanism 4.

The plasma generator 1 is a device for causing discharge of the gas in the alumina discharge tube 2 to generate a plasma and generate the first and second activated species gas and is comprised of a microwave generator 10 and waveguide tube 11.

The microwave generator 10 is a magnetron and can generate a microwave M of a predetermined frequency.

The waveguide tube 11 propagates the microwave M generated from the microwave generator 10 and has a hole 12 through which the alumina discharge tube 2 is inserted.

The inside of the left end of the waveguide tube 11 is provided with a reflection plate (short plunger) 13 reflecting the microwave M to form a standing wave. Further, in the middle of the waveguide tube 11 are provided a 3-stub tuner 14 for phase alignment of the microwave M and an isolator 15 for bending the reflected microwave M heading toward the microwave generator 10 in the 90° direction (front surface direction of FIG. 1).

The alumina discharge tube 2 is a cylindrical body having a nozzle portion 20 at its lower end, the top end thereof is connected to a feed pipe 30 of the gas feed device 3.

The gas feed device 3 is a device for feeding gas to the inside of the alumina discharge tube 2. The gas feed device 3 has a bomb 31 for $SF_6$ (sulfur hexafluoride) gas, a bomb 32 for $O_2$ (oxygen) gas, and a bomb 33 for $CF_4$ (carbon tetrafluoride) gas and these bombs 31, 32, and 33 are connected through a valve 37 and flow controllers 34, 35, 36 to the feed pipe 30. Due to this, the $SF_6$ gas bomb 31, flow controller 34, valve 37, and feed pipe 30 constitute a first gas feed unit, while the $O_2$ gas bomb 32, $CF_4$ gas bomb 33, flow controllers 35, 36, valve 37, and feed pipe 30 constitute a second gas feed unit.

Due to the plasma generator 1 having this configuration, when gas is fed from the gas feed device 3 to the alumina discharge tube 2 and a microwave M is generated from the microwave generator 10, plasma discharge occurs at the location of the alumina discharge tube 2 corresponding to the hole 12 and the activated species gas generated by the plasma discharge is sprayed from the nozzle portion 20.

The silicon wafer W is designed to be arranged above a chuck 7 in the chamber 6. The chuck 7 has a mechanism for picking up a silicon wafer W by static electricity.

The chamber 6 is provided with a vacuum pump 60. This vacuum pump 60 can be used to create a vacuum in the chamber 6. Further, a hole 61 is formed in the center of the top surface of the chamber 6. A nozzle portion 20 of the alumina discharge tube 2 is inserted into the chamber 6 through this hole 61. An O-ring 62 is fit between the hole 61 and the alumina discharge tube 2 to hold the space between the hole 61 and the alumina discharge 2 air tight. The chamber 6 as a whole can be moved vertically relative to the alumina discharge tube 2.

A duct 63 is provided around the nozzle portion 20 inserted in this hole 61. By driving the vacuum pump 64, it is possible to exhaust the reaction product gas to the outside of the chamber 6 at the time of etching.

The X-Y drive mechanism 4 is arranged inside this chamber 6 and supports the chuck 7 from below.

This X-Y drive mechanism 4 makes the chuck 7 move laterally in FIG. 1 by an X-drive motor 40 and makes the chuck 7 and the X-drive motor 40 move perpendicularly with respect to the surface of FIG. 1 together by a Y-drive motor 41. That is, it is possible to make the nozzle portion 20 move relatively in the X-Y direction with respect to the silicon wafer W by the X-Y drive mechanism 4.

The Z-drive mechanism 5 supports the X-Y drive mechanism 4 as a whole in the chamber 6 from the bottom. The Z-drive mechanism 5 makes the X-Y drive mechanism 4 as a whole move vertically by the Z-drive motor 90 to enable adjustment of the distance between the opening 20a of the nozzle portion 20 and the front surface of the silicon wafer W.

The X-drive motor 40 and the Y-drive motor 41 of the X-Y drive mechanism 4 and the Z-drive motor 90 of the Z-drive mechanism 5 are controlled by a control computer 45 based on a predetermined program.

Next, an explanation will be made of the operation of the wafer flattening system of this embodiment. Note that the operation of the wafer flattening system specifically realizes the wafer flattening process of the present invention.

First, the wafer flattening system is operated to execute the local etching step.

That is, in the state with the silicon wafer W picked up by the chuck 7, the vacuum pump 60 is driven to create a low atmospheric pressure state of 0.1 Torr to 5.0 Torr in the chamber 6 and the Z-drive mechanism 5 is driven to raise the X-Y drive mechanism 4 as a whole to bring the silicon wafer W to about 4 mm below the nozzle portion 20.

In this state, the valve 37 of the gas feed device 3 is opened, the $SF_6$ gas in the bomb 31 is made to flow out of the feed pipe 30, and the $SF_6$ gas is fed inside the alumina discharge tube 2 serving as the first discharge tube.

At this time, the opening degree of the valve 37 is adjusted to maintain the pressure of the $SF_6$ gas at a predetermined pressure and the flow controller 34 is used to control the flow rate of the $SF_6$ gas.

When the microwave generator 10 is driven in parallel with this feed operation of $SF_6$ gas, the microwave M causes the $SF_6$ gas present at the discharge location to discharge to generate a plasma and generate a first activated species gas G1 containing F (fluorine) radicals. Due to this, the first activated species gas G1 is guided into the nozzle portion 20 of the alumina discharge tube 2 and sprayed from the opening 20a of the nozzle portion 20 to the silicon wafer W side.

In this state, the X-Y drive mechanism 4 is driven by the control computer 45 and the chuck 7 picking up the silicon wafer W is made to move in a zig-zag in the X-Y direction.

Figure 2:
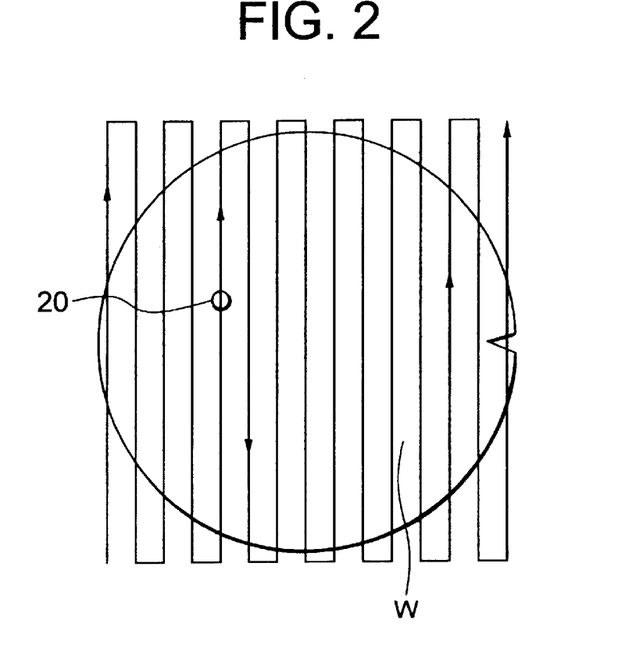
FIG. 2 is a plan view showing the state of scanning of the silicon wafer W by the nozzle portion.

That is, as shown in FIG. 2, the nozzle portion 20 is made to move in a zig-zag relative to the silicon wafer W. At this time, the relative speed of the nozzle portion 20 with respect to the silicon wafer W is set to be substantially inversely proportional to the thickness of the relatively thick portion.

Figure 3:
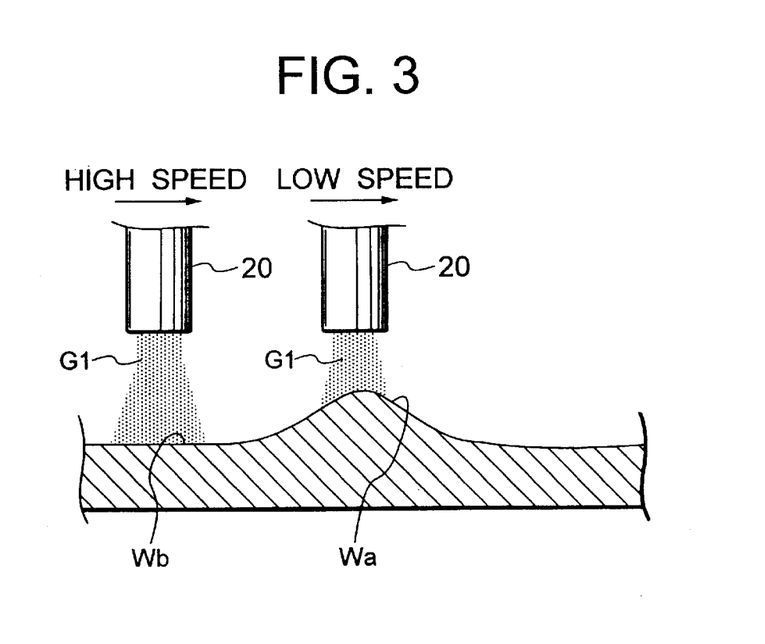
FIG. 3 is a cross-sectional view of the state of local etching by a first activated species gas.

Due to this, as shown in FIG. 3, the nozzle portion 20 moves directly over the non relatively thick portion Wb at a high speed and when arriving above the relatively thick portion Wa is reduced in speed in accordance with the thickness of the relatively thick portion Wa. As a result, the etching time with respect to the relatively thick portion Wa becomes longer and the relatively thick portion Wa is shaved flat. By etching the entire front surface of the silicon wafer W in this way, the local etching step is completed.

This local etching step enables achievement of flattening of the front surface of the silicon wafer W, but there may be a slight roughness at the front surface of the silicon wafer W.

Therefore, the wafer flattening system is made to operate in the following manner to perform the smoothing step for the silicon wafer W after the local etching step.

That is, the X-Y drive mechanism 4 shown in FIG. 1 stops being driven, the valve 37 of the bomb 31 is closed, then the Z-drive mechanism 5 is driven to lower the entire X-Y drive mechanism 4 as a whole in the state holding the degree of vacuum in the chamber 6 etc. at the above conditions. Due to this, the silicon wafer W is moved away to about 250 mm below the nozzle portion 20.

The valves 37 of the bombs 32, 33 of the gas feed device 3 are opened in this state to allow $O_2$ gas and $CF_4$ gas to flow out to the feed pipe 30 and form a mixed gas (second mixed gas) to be supplied to the inside of the alumina discharge tube 2 as the second discharge tube.

At this time, the opening degrees of the valves 37 are adjusted to maintain the pressure of the $O_2$ gas and $CF_4$ gas at predetermined pressures and the flow controllers 35, 36 are used to adjust the flow rates of the $O_2$ gas and $CF_4$ gas and set the ratio of the $O_2$ gas with respect to the $CF_4$ gas in the mixed gas fed to the alumina discharge tube 2 to a value between 200 and 400 percent.

When the microwave generator 10 is then driven and a microwave M used to make the mixed gas discharge and generate a plasma, a second activated species gas G2 containing a larger amount of O radicals than F radicals is generated. Due to this, the second activated species gas G2 is sprayed from the opening of the nozzle portion 20 of the alumina discharge tube 2 to the silicon wafer W side.

Figure 4:
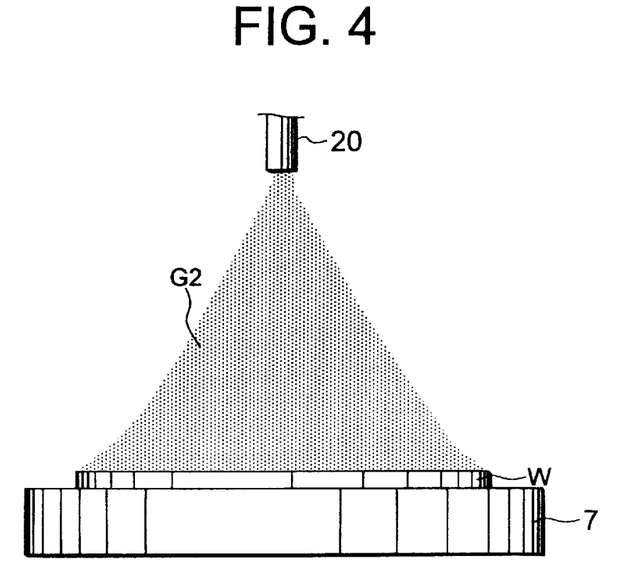
FIG. 4 is a schematic view of the state of diffusion of a second activated species gas from the nozzle portion of an alumina discharge tube toward the entire surface of the silicon wafer.

At this time, since the silicon wafer W is located away from the nozzle portion 20 of the alumina discharge tube 2, as shown in FIG. 4, the activated species gas G2 sprayed from the nozzle portion 20 spreads downward and strikes the entire front surface of the silicon wafer W.

Figure 5:
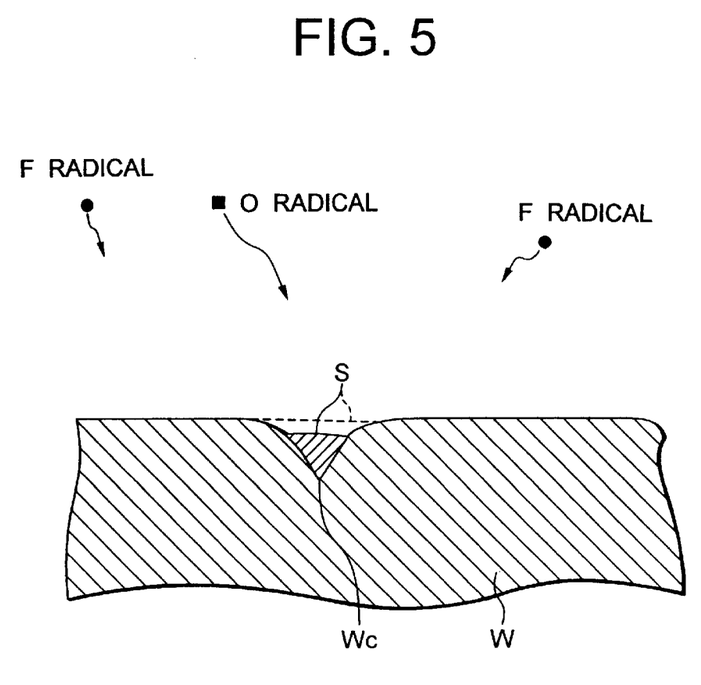
FIG. 5 is a cross-sectional view of the state of smoothing by the second activated species gas.

When the second activated species gas G2 is blown on the front surface of the silicon wafer W, as shown in FIG. 5, since O radicals are present, a reaction product S believed to be SiOxFy (x, y=1, 2, . . . ) is generated. Further, the F radicals etch the front surface of the silicon wafer W. Further, the reaction product S occurs at the entire front surface of this silicon wafer W, but the vapor pressure causes the majority of the reaction product S to evaporate and the reaction product S accumulated in the fine recesses Wc causing roughness to remain without being evaporated. Therefore, the reaction product S accumulates in the recesses Wc to protect the recesses from being etched by the F radicals, so only the portions other than the recesses Wc are etched by the F radicals.

Therefore, as shown by the broken line in FIG. 5, when the surface of the reaction product S successively deposited in the recesses Wc becomes equal to the surface of the portions being etched, the plasma generator 1 stops being driven, the valves 37 of the bombs 32, 33 are closed, and the second activated species gas G2 stops being sprayed from the nozzle portion 20.

Due to this, the smoothing step is ended and it is possible to obtain a silicon wafer W with a substantially completely flattened front surface.

In this way, according to the wafer flattening system of this embodiment, since it is possible to substantially completely eliminate the roughness of the front surface of the silicon wafer W caused by the local etching, it is possible to improve the RMS of the silicon wafer W.

Figure 6:
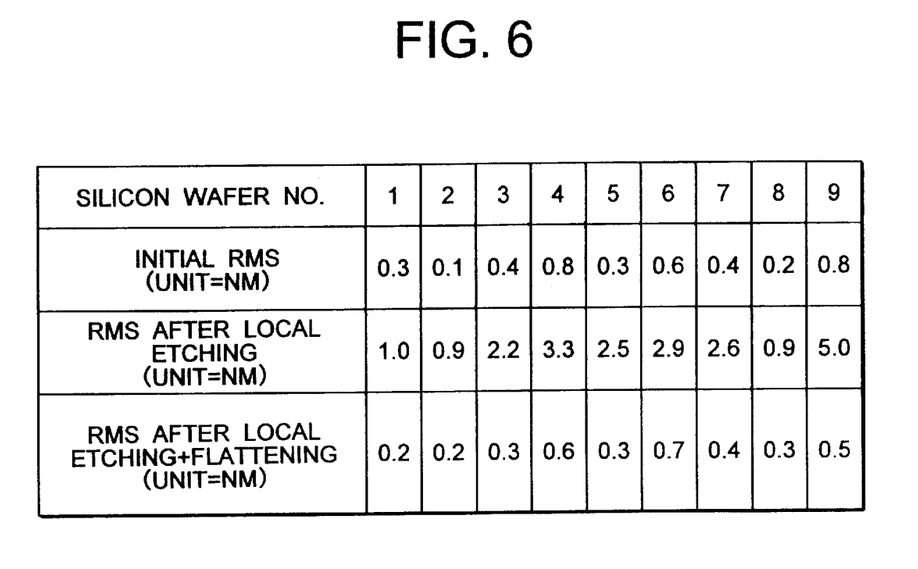
FIG. 6 is a table of the results of experiments.

To prove this point, the present inventors set the ratio of the $O_2$ gas with respect to the $CF_4$ gas in the mixed gas to 250 percent when performing the smoothing step and performed the local etching step and smoothing step on nine silicon wafers W under the same conditions as this embodiment, whereupon the results shown in FIG. 6 were obtained.

As shown in FIG. 6, when nine silicon wafers W with initial RMS's of 0.3 nm, 0.1 nm, 0.4 nm, 0.8 nm, 0.3 nm, 0.6 nm, 0.4 nm, 0.2 nm, and 0.8 nm were flattened by the local etching step, the RMS's deteriorated to 1.0 nm, 0.9 nm, 2.2 nm, 3.3 nm, 2.5 nm, 2.9 nm, 2.6 nm, 0.9 nm, and 5.0 nm.

When the smoothing step was then further performed on the nine silicon wafers W, the RMS's of the nine silicon wafers W became 0.2 nm, 0.2 nm, 0.3 nm, 0.6 nm, 0.3 nm, 0.7 nm, 0.4 nm, 0.3 nm, and 0.5 nm.

That is, the result was obtained that it is possible to improve the RMS of the silicon wafer W to better than the initial value by flattening the silicon wafer W by the local etching step, then performing the smoothing step.

Note that depending on the state of roughness of the front surface of the silicon wafer W after the local etching step and the state of spraying of the second activated species gas G2, the second activated species gas G2 may not be blown uniformly over the entire front surface of the silicon wafer W.

Figure 7:
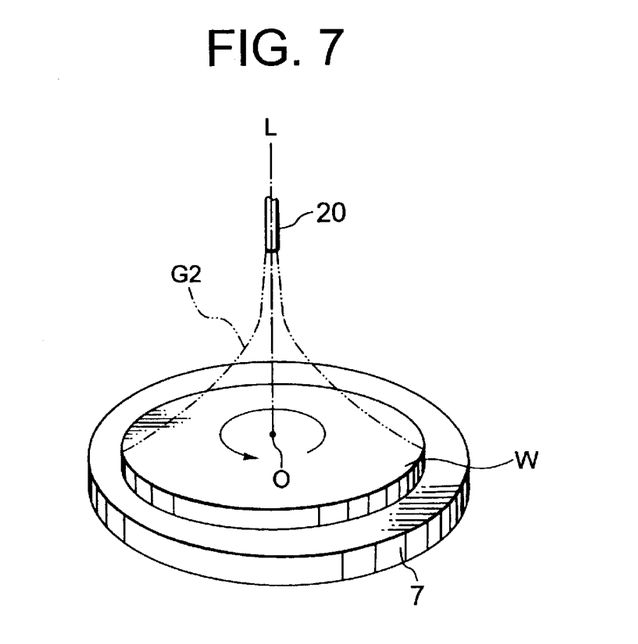
FIG. 7 is a perspective view of the state of the silicon wafer being made to rotate around the center line of the nozzle portion.

Therefore, as shown in FIG. 7, by driving the X-Y drive mechanism 4 and making the silicon wafer W rotate on the center line L in the state with the center line L of the nozzle portion 20 and the center point 0 of the silicon wafer W aligned, it is possible to blow the second activated species gas G2 uniformly over the entire front surface of the silicon wafer W.

Figure 8:
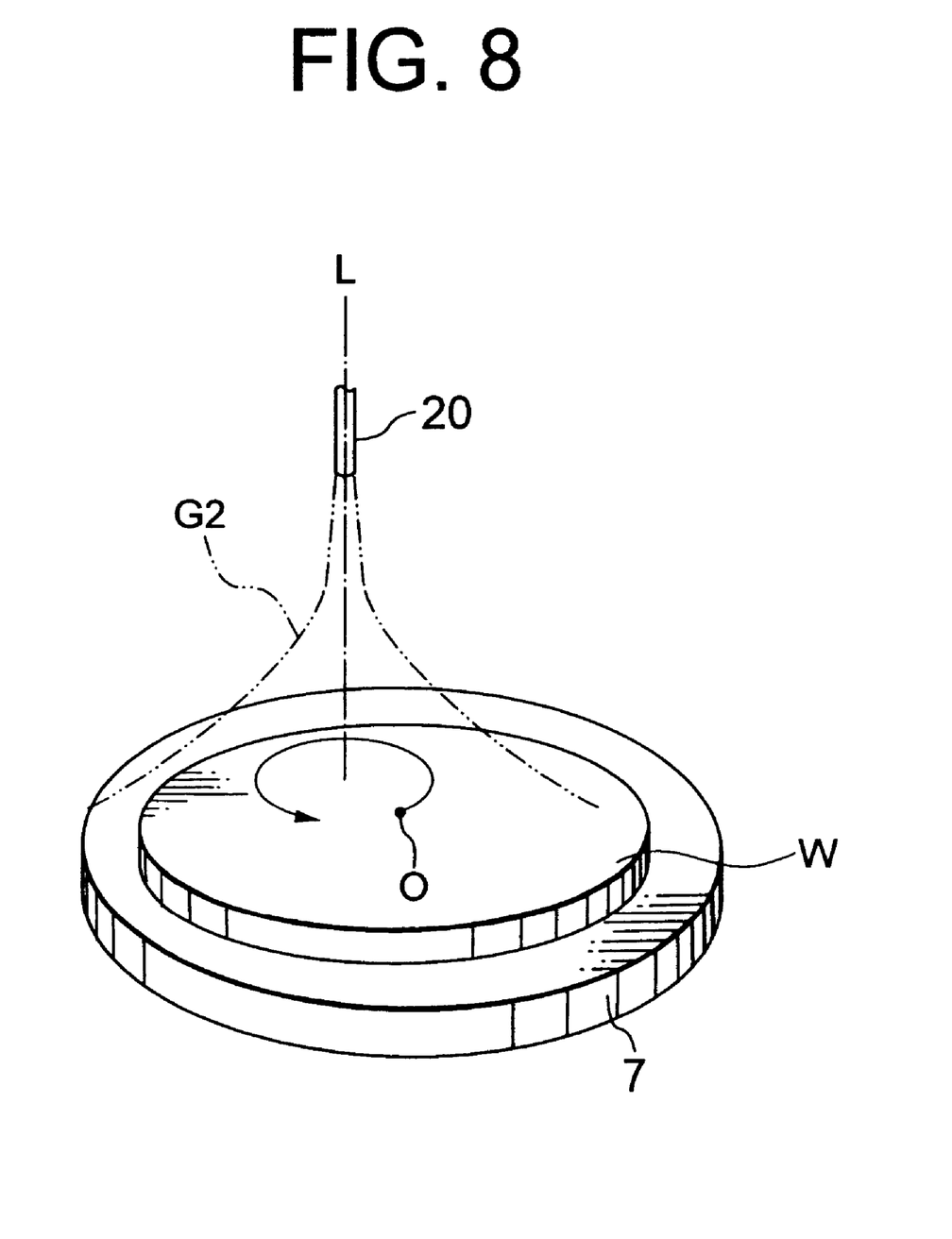
FIG. 8 is a perspective view of the state of the silicon wafer being made to revolve around the center line of the nozzle portion.

Further, as shown in FIG. 8, it is also possible to make the silicon wafer W revolve around the center line L in the state with the center line L of the nozzle portion 20 and the center point 0 of the silicon wafer W offset. In this case, it is possible to blow the second activated species gas G2 uniformly by making the silicon wafer W rotate on the center point 0.

(Second Embodiment)

Figure 9:
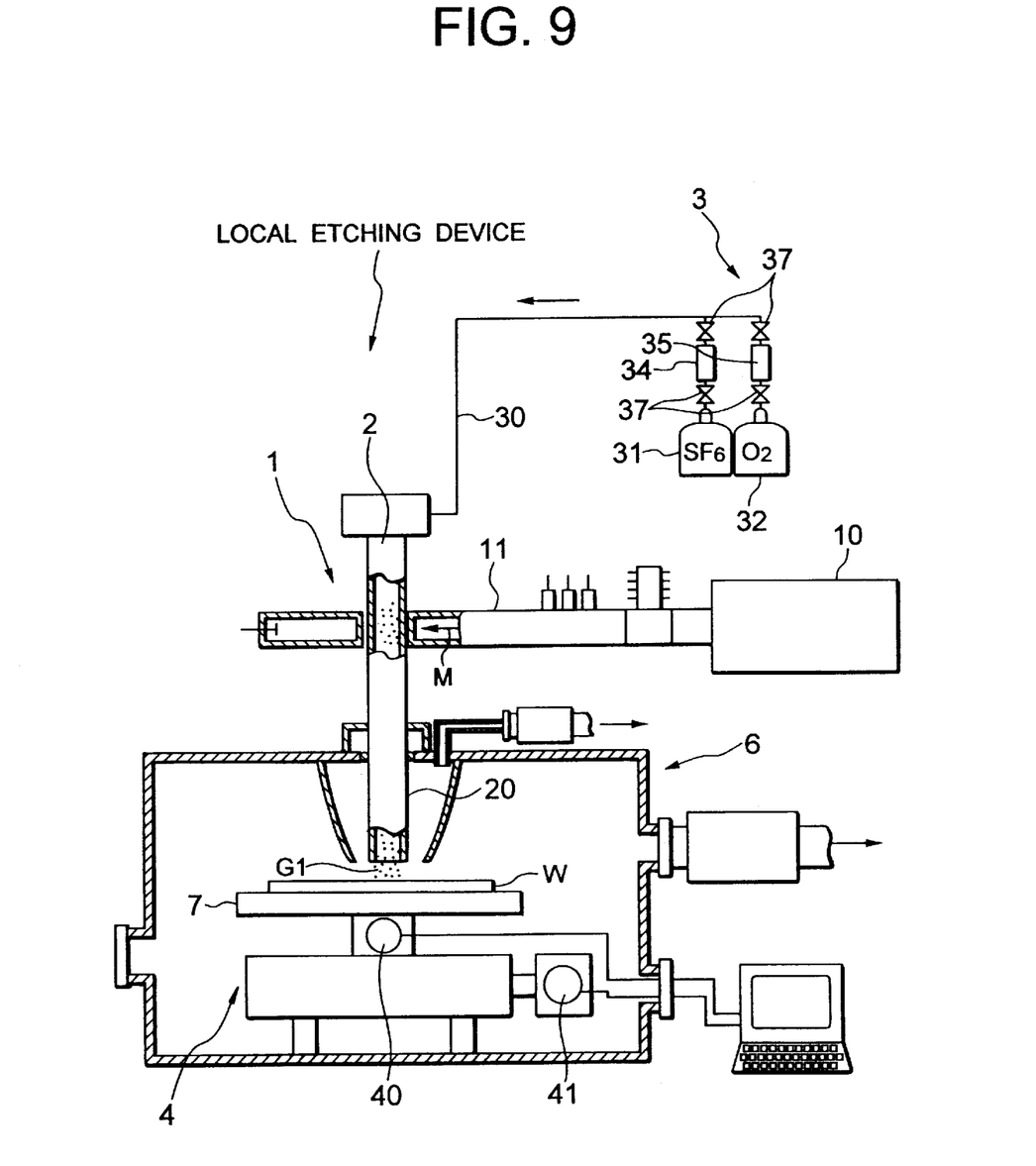
FIG. 9 is a schematic cross-sectional view of a local etching device of a wafer flattening system according to a second embodiment of the present invention.
Figure 10:
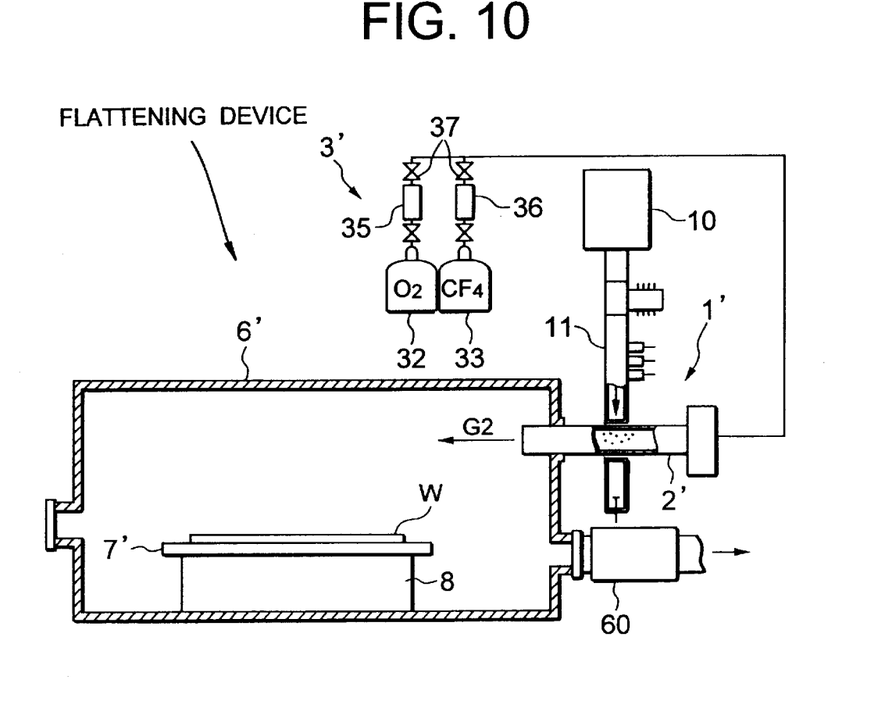
FIG. 10 is a schematic cross-sectional view of a smoothing device of a wafer flattening system according to a second embodiment of the present invention.

FIG. 9 is a schematic cross-sectional view of a local etching device of a wafer flattening system according to a second embodiment of the present invention; and FIG. 10 is a schematic cross-sectional view of a smoothing device of this wafer flattening system. Note that the explanation is given by attaching the same reference numerals to members the same as those shown in FIG. 1 to FIG. 8.

The wafer flattening system, as shown in FIG. 9 and FIG. 10, differs from the wafer flattening system according to the first embodiment in the point that the local etching device for performing the local etching step and the smoothing device for performing the smoothing step are made separate.

The local etching device, as shown in FIG. 9, is comprised of a plasma generator 1 serving as the first plasma generation unit, an alumina discharge tube 2 serving as the first discharge unit, a gas feed device 3 serving as the first gas feed unit, and an X-Y drive mechanism 4 serving as the first drive unit.

The gas feed device 3 is a device for feeding an $SF_6$ gas to the inside of the alumina discharge tube 2 and has a $SF_6$ gas bomb 31 connected to a feed pipe 30 through the feed controller 34 and valve 37. These constitute the first gas feed unit.

Due to this configuration, when the flow rate of the $SF_6$ gas is adjusted by the flow controller 34 to feed the $SF_6$ gas inside the alumina discharge tube 2 and the microwave generator 10 of the plasma generator 1 is driven, the first activated species gas G1 containing the F radicals is generated and sprayed from the opening of the nozzle portion 20 of the alumina discharge tube 2 to the silicon wafer W side.

By driving the X-Y drive mechanism 4 in state and making the chuck 7 picking up the silicon wafer W move zig-zag in the X-Y direction to locally etch the relative thick portions of the silicon wafer W, it is possible to perform the local etching step.

On the other hand, the smoothing device, as shown in FIG. 10, is provided with a plasma generator 1' serving as the second plasma generation unit, an alumina discharge tube 2' serving as the second discharge tube, a gas feed device 3' serving as the second gas feed unit, and a chuck 7' affixed on a base 8 in the chamber 6'.

The alumina discharge tube 2' is attached to the side surface of the chamber 6' in the state with the nozzle portion 20' inserted in the chamber 6'.

The gas feed device 3' is a device for feeding a mixed gas of the above $O_2$ gas and $CF_4$ gas (second mixed gas) inside the alumina discharge tube 2' and has an $O_2$ gas bomb 32 and $CF_4$ gas bomb 33 connected through the flow controllers 35, 36 and valves 37 to the feed pipe 30. These constitute the second gas feed unit.

Due to this configuration, when a mixed gas adjusted to a ratio of the $O_2$ gas with respect to the $CF_4$ gas of a value between 200 to 400 percent by the flow controllers 35, 36 is fed to the alumina discharge tube 2' and the microwave generator 10 of the plasma generator 1' is driven, the second activated species gas G2 containing a larger amount of O radicals than F radicals is generated and the second activated species gas G2 is filled in the chamber 6' from the opening of the nozzle portion 20 of the alumina discharge tube 2'.

In this state, when the silicon wafer W flattened by the local etching step of the local etching device is conveyed to the inside of the chamber 6' filled with the second activated species gas G2 and placed on the chuck 7' and the entire surface of the silicon wafer W is exposed to the second activated species gas G2 for a predetermined period, the roughness of the front surface of the silicon wafer W is smoothed by the same action as that shown in FIG. 5 and thereby the smoothing step can be performed.

In this way, the wafer flattening system of this embodiment is configured to be able to perform the local etching step and the smoothing step separately by a separate local etching device and smoothing device. Therefore, there is no need to make the next silicon wafer stand by until the completion of the smoothing step of a prior silicon wafer as in the wafer flattening system of the first embodiment and as a result it is possible to raise the throughput of the silicon wafer W processing.

The rest of the configuration and the mode of operation and advantageous effects are similar to those of the first embodiment explained above, so explanations thereof will be omitted.

Note that the present invention is not limited to the above embodiments. Various modifications and changes may be made within the scope of the gist of the invention.

For example, in the above embodiment, as the fluorine compound of the first gas feed unit, $SF_6$ gas was used, but it is also possible to use $CF_4$ gas or $NF_3$ (nitrogen trifluoride gas). Further, while the first feed unit to the alumina discharge tube 2 are configured to feed solely $SF_6$ gas, but it is also possible to configure them to feed a mixed gas of $SF_6$ gas and $O_2$ gas and other gas (first mixed gas) to the alumina discharge tube 2.

Further, as the mechanism for making the nozzle portion 29 move relative to the silicon wafer W, an X-Y drive mechanism 4 was used, but it is also possible to use an r-θ drive mechanism for making the nozzle portion 20 move relative to the radial direction and center angle direction of the nozzle portion 20.

Further, in the above embodiment, as the first and second plasma generation units, use was made of the plasma generator 1 for generating a microwave to generate plasma, but any means able to generate an activated species gas may be used. For example, of course it is possible to use a plasma generator which generates a plasma using a high frequency to generate an activated species gas and various other types of plasma generators.

As explained above in detail, according to the present invention, since the first activated species gas is used to flatten the front surface of the wafer, then the second activated species gas is used to smooth the surface of the wafer, it is possible to remarkably reduce the surface roughness of the wafer and as a result there is the superior effect of providing a high quality wafer.

What is claimed is:

1. A wafer flattening process comprising:

a local etching step for spraying a first activated species gas, generated by causing a fluorine compound gas or a first mixed gas containing a fluorine compound to discharge and generate a plasma, from a nozzle portion of a first discharge tube to a relatively thick portion of a surface of the wafer to locally etch the relatively thick portion; and a smoothing step for spraying a second activated species gas, generated by making a second mixed gas containing carbon tetrafluoride and oxygen discharge to generate a plasma, over the entire surface of the wafer after said local etching step, thereby depositing reaction products of the second activated species gas inside fine recesses of the surface in the wafer so as to smooth the entire surface of the wafer.

2. A wafer flattening process as set forth in claim 1, wherein the fluorine compound in said local etching step is selected from the group consisting of carbon tetrafluoride, sulfur hexafluoride, and nitrogen trifluoride.

3. A wafer flattening process as set forth in claim 1, wherein the ratio of oxygen to carbon tetrafluoride in said smoothing step is set to 200 to 400 percent on a mass flow rate basis.

4. A wafer flattening process as set forth in claim 3, wherein said smoothing step diffuses and sprays the second active species gas from the nozzle portion of the second discharge tube facing the front surface of the wafer a predetermined distance away from it to the entire front surface of the wafer.

5. A wafer flattening process as set forth in claim 4, wherein the center of the nozzle portion of the second discharge tube and the center of the wafer are substantially aligned and the wafer is made to rotate on the center.

6. A wafer flattening process as set forth in claim 4, wherein the center of the nozzle portion of the second discharge tube and the center of the wafer are offset and the wafer is made to revolve around the center of the nozzle portion.

* * * * *